United States Patent
Shamansky et al.

[11] Patent Number: 5,760,735
[45] Date of Patent: Jun. 2, 1998

[54] PHASE STATIONARY TEST BODY

[75] Inventors: Harry Thomas Shamansky, Bexley; Allen Keith Dominek, Columbus; Stephen Walter Schneider; Jeff Alan Hughes, both of Beavercreek, all of Ohio

[73] Assignee: The United States of America as represented by the Secretary of the Air Force, Washington, D.C.

[21] Appl. No.: 734,688

[22] Filed: Oct. 21, 1996

[51] Int. Cl.$^6$ ........................................... G01S 7/40
[52] U.S. Cl. ........................................... 342/165
[58] Field of Search ........................... 342/165, 4, 5, 342/169, 173, 174

[56] References Cited

U.S. PATENT DOCUMENTS

| | | | |
|---|---|---|---|
| 4,704,614 | 11/1987 | Poirier et al. | 343/703 |
| 4,754,496 | 6/1988 | Fishkin et al. | 455/67 |
| 4,809,003 | 2/1989 | Dominek et al. | 342/165 |
| 4,864,315 | 9/1989 | Mohuchy | 343/703 |
| 4,879,560 | 11/1989 | McHenry | 342/165 |
| 4,901,080 | 2/1990 | McHenry | 342/4 |
| 5,038,146 | 8/1991 | Troychak et al. | 342/173 |
| 5,075,681 | 12/1991 | Kartiala | 342/165 |
| 5,099,244 | 3/1992 | Larson | 342/165 |
| 5,311,191 | 5/1994 | Scannapieco | 342/165 |
| 5,485,158 | 1/1996 | Mailloux et al. | 342/165 |

Primary Examiner—Daniel T. Pihulic
Attorney, Agent, or Firm—Gina S. Tollefson; Gerald B. Hollins; Thomas L. Kundert

[57] ABSTRACT

An antenna test body for providing azimuth and elevation rotation having a rotating cylinder contained within said test body and an arc sector under the test body capable of providing elevation rotation. The test body provides a phase stationary center point under rotation of both azimuth and elevation.

17 Claims, 4 Drawing Sheets

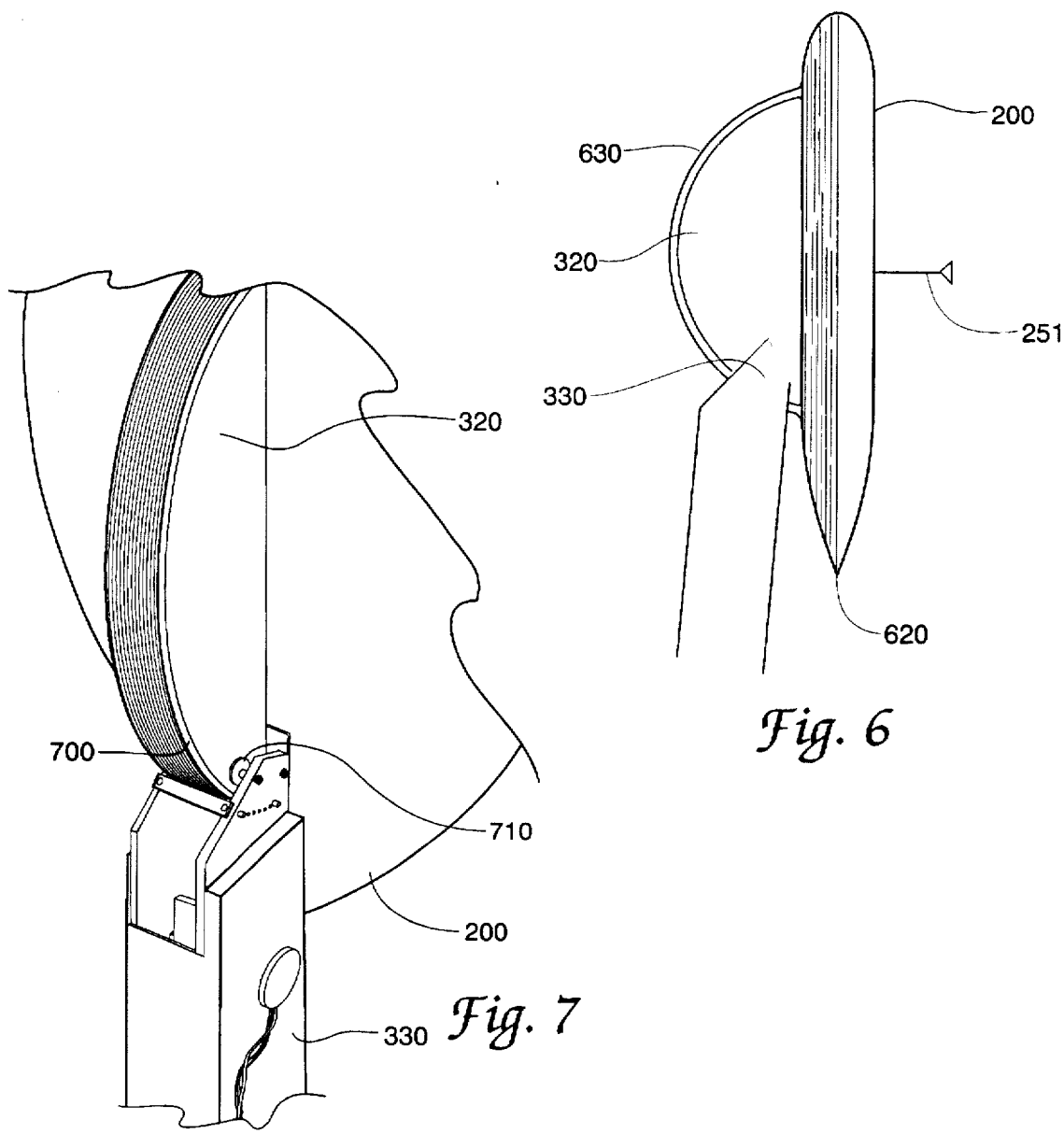

5,760,735

PHASE STATIONARY TEST BODY

RIGHTS OF THE GOVERNMENT

The invention described herein may be manufactured and used by or for the Government of the United States for all governmental purposes without the payment of any royalty.

BACKGROUND OF THE INVENTION

This invention relates to the use of test bodies in radio frequency measurement ranges.

Test bodies are used for two specific purposes. First, a test body is used to test the capabilities of a radar cross section (RCS) range or radio frequency measurement. range to ascertain that measurements made on that range are accurate; and second, a test body is used to support components and simulate ground planes for testing in a radio frequency measurement range. A radio frequency measurement range is a laboratory facility which consists of the instrumentation and physical space required to measure the radiation patterns of antennas away from their operational environments.

The worthiness of a particular body as a test body is in large part determined by the test body and mount having a low return relative to the radio frequency measurement range. The test body's RCS and component to test body interaction, and the test body and mounting equipment interaction, must be small for minimal component measurement error. This is important so that the quality of the measurement is not strongly dependent on vector background subtraction and test body stability. A known test body shape called the almond test body satisfies this condition when a Styrofoam support mount is used. Other known ogival shaped test bodies satisfy this condition to a lesser degree.

The almond test body shape is widely used in the art. An oblique view of an almond test body is shown in FIG. 1. The almond test body is described in U.S. Pat. No. 4,809,003 and was specifically designed for low signatures in a forward sectoral tip region. In the sectoral tip region, the only scattering mechanisms are tip and creeping wave scattering. No other significant scattering mechanisms exist since the body is smooth and continuous to its second derivative except at its tip.

Once selection of a basic test body shape for testing in a radio frequency measurement range has been made, the next consideration is (1) the positioning of the antenna under test (AUT) in the test body, and (2) the positioning of the test body, in the radio frequency measurement range. For positioning an AUT in the test body, it is common practice to place the antenna in a ground plate and seat the ground plate into an aperture located on the top planar surface of the test body. The antenna and ground plate remain stationary in the test body aperture.

For positioning of the test body in the radio frequency measurement range, a number of different, often ad hoc techniques are employed. For example, it is known to use mounts such as a metal ogival pedestal or a foam pedestal to position the test body in the antenna test range. Regardless of the method chosen, the designer is faced with special consideration for azimuth and elevation rotation requirements. It is necessary to rotate an antenna in a radio frequency measurement range in order to obtain pattern cuts of the radiation sphere of the antenna. Because the antenna and ground plate remain stationary in the test body, the entire test body must be rotated to obtain the pattern cuts of the radiation sphere of the antenna mounted thereon.

Therefore, the mounts or pedestals holding the test body are generally motorized to rotate the entire test body. For example, it is common practice to rotate in the azimuth axis a foam pedestal holding an almond test body in order to rotate the antenna on the planar surface of the almond test body. The motor and gear for rotating the foam pedestal are located between the floor of the radio frequency measurement range and the bottom of the foam pedestal. The problem with rotating the entire test body is that the ideal position of the almond test body, the tip directed at the incident beam, cannot be maintained. Directing the tip of the almond test body at the incident beam minimizes scattering.

In addition to azimuth rotation, the antenna must be elevated to obtain pattern cuts of the complete radiation sphere of the antenna. It is common practice to take pattern cut measurements of the radiation sphere by changing the axis of the antenna. As an example, assume an almond test body mounted on a rotatable foam pedestal. The almond test body is removed from the pedestal, the side of the almond test body is often punctured and remounted sideways on the pedestal with the antenna in a horizontal position and the test body rotated about the azimuth axis. The drawbacks of this technique are that it is impossible to obtain measurements of the radiation sphere in elevation and azimuth at the same time or on the same reference axis, so there is no stationary reference point that all measurements are obtained from. The lack of a stationary reference point requires some type of error correction which contributes to the inaccuracy of the predicted radiation sphere. It is not known in the art to change the axis of the test body mount in the radio frequency measurement range in order to take elevation measurements. In sum, traditional positioning techniques result in a number of problems in the rotational measurements such as phase variation during rotation in azimuth and elevation.

SUMMARY OF THE INVENTION

The present invention solves the problems in the art of azimuth and elevation rotation and does so with a phase stationary reference aperture for the AUT. The present invention provides an in-body antenna azimuth rotation system which eliminates the need to rotate the entire test body and an arc support integral with and under the test body to provide accurate elevation rotation which additionally provides a phase stationary aperture for the AUT.

An object of the present invention is to provide a high performance phase-stationary antenna test body under rotation of both azimuth and elevation.

It is an advantage of the present invention to provide azimuth and elevation positioning free from compound positional error.

It is a feature of the present invention to maintain the test body in its optimal position in the antenna test range.

These and other objects, advantages and features of the present invention are achieved by a phase stationary antenna test body comprising:

a test body having a top, a bottom, an internal surface, an external surface and an axis of rotation, said top having an aperture for seating an antenna therein;

a right angle circular cylinder for rotating said antenna having a top and a bottom, rotatably connected to the internal bottom surface of said test body and axially aligned with said axis of rotation of said test body and having a static point of rotation between said test body and said cylinder;

an arc sector for variably elevating said test body, having intersecting planar and arcuate components, said planar component integral with said bottom external surface of said test body and axially aligned with said axis of rotation of said test body resulting in a static point of rotation coincident with said static point of rotation of said cylinder; and support means for supporting said test body, said arcuate component of said arc sector rotatably connected thereto.

BRIEF DESCRIPTION OF THE DRAWINGS

FIG. 6 shows a side view of the test body in an elevated position.

FIG. 7 shows an oblique view of the test body and arc sector.

DETAILED DESCRIPTION

The present invention is a novel design test body and mount which provides complete phase stability for both azimuth and elevation rotation and delivers very high performance for the most demanding antennas under test. Problems in the art associated with azimuth and elevation rotation are solved using the present invention while at the same time increasing the accuracy of the measurements obtained from the radio frequency measurement range.

Figure 1:
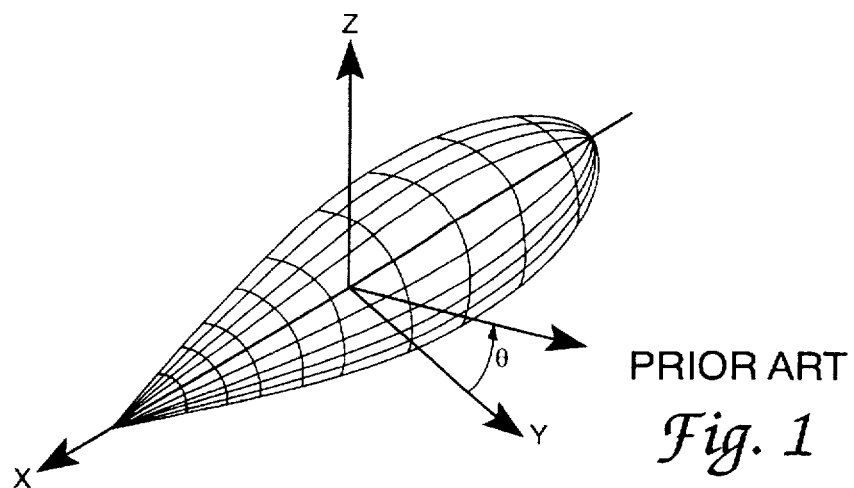
FIG. 1 shows a prior art almond test body.
Figure 2:
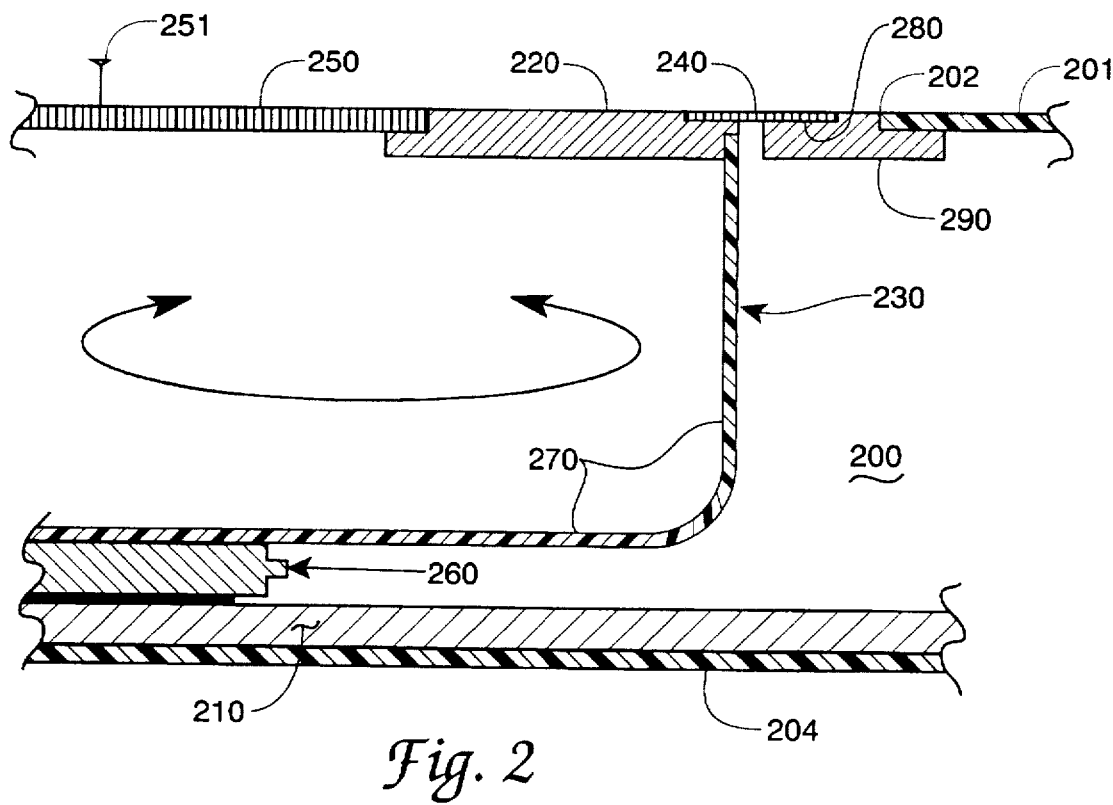
FIG. 2 shows a cross-sectional view of a preferred embodiment of the present invention depicting a rotating cylinder within a test body.

The problem of rotating an entire test body to take pattern cut measurements of an antenna in the radio frequency measurement range results in unoptimal positions of the test body relative to the incident beam and produces scattering, thereby reducing the accuracy of measurements. The present invention solves this problem by holding a test body fixed in azimuth and allowing an in-body rotating cylinder to rotate an antenna. FIG. 2 of the drawings is a cross sectional view of a cylinder 230 seated in the interior of a test body 200 between top 201 and bottom 204 surfaces of the test body. A gear 260 for rotating the cylinder 230 within the test body 200 is located between the bottom of the cylinder and the bottom interior surface 210 of the test body. The cylinder 230 rotates and in turn rotates an antenna 251 seated on top of the cylinder in a ground plate 250. The advantage of rotating the cylinder and in turn the antenna within the test body is that it is not necessary to rotate the entire test body. The rotating cylinder 230 allows the test body 200 to remain stationary in its optimal position relative to the incident beam during the entire test. For example, if an almond test body was employed, the test body is fixed in azimuth which would allow for a larger overall test body size if desired and thus support larger antennas under test. The tip of the almond test body is directed at an incident beam throughout the test to minimize the cross-range clearance impact. This is a substantial improvement over current methods in which a test body is generally seated on a motorized cone which rotates the entire test body in order to take measurements of the radiation sphere of an antenna.

Known test bodies which seat an AUT in a non-rotating aperture plate generally use conducting tape of the type found in the home to seal a gap between the antenna ground plate and the test body aperture. The present invention uses a wiper 240 to prevent the entry of stray signals into the interior of the test body 200. It also provides an uninterrupted continually conducting surface and seals the gap between the top surface 201 of the test body and the cylinder 230 for maximum fidelity. An inner rim 220 bonded to the cylinder 230 secures the rotating wiper 240 to the top of the cylinder with the horizontal extension of the wiper seated in a lip 280 of an outer rim 290 of the test body 200. The top of the test body which includes a top planar surface 201 of the test body, the antenna ground plate 250 and the wiper 240, is coplanar to simulate an infinite ground plane. The wiper 240 rotates as the cylinder 230 rotates in order to provide electrical continuity to the antenna ground plate 250. The wiper is generally made of a durable conductive alloy, such as stainless steel or aluminum. The upper surface of the wiper 240 of the present invention is generally coated with a conducting material, such as silver or nickel, as is the test body, to produce a continuous, electrically conductive surface. As wiper 240 wears, the potential for energy entering the test body interior increases, at which time either 1) application of a conductive grease or 2) lip 280 replacement may be necessary.

The rotating cylinder is preferably fabricated out of a fiber resin material to keep overall system weight to a minimum and maintain dimensional stability.

Figure 3:
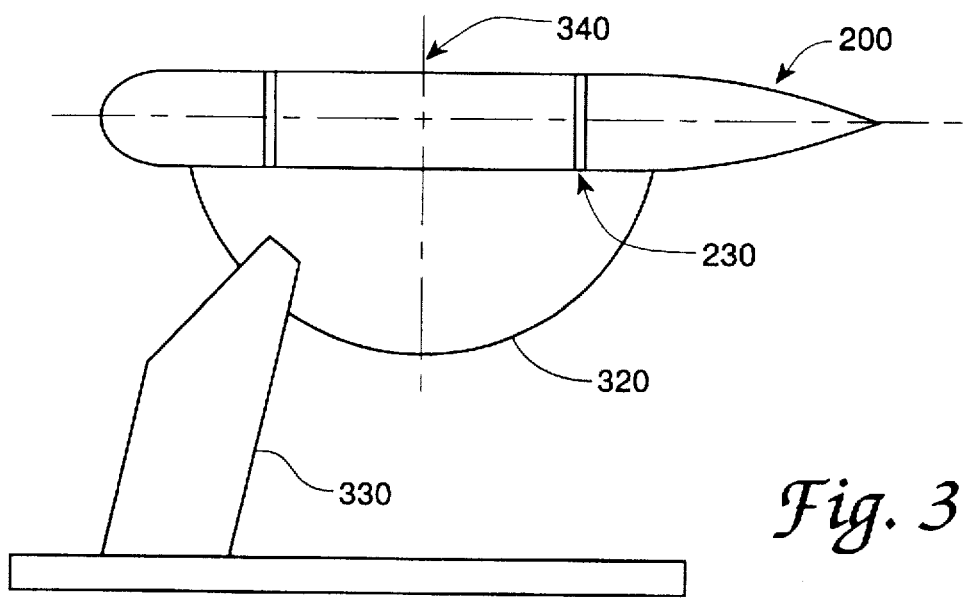
FIG. 3 shows a side view of the test body in accordance with the invention.

In addition to solving the problem of azimuth rotation, the present invention also solves the very daunting problem of elevation rotation by introducing an arc sector into the test body. The arc sector is attached to the core of the test body below the AUT. FIG. 3 is a side view of the present invention showing the test body 200 with the rotating cylinder 230 seated therein, an arc sector 320 thereunder and a support stand 330. A phase stationary reference aperture of the AUT is illustrated at 340. The side and top views of FIGS. 4 and 5 further illustrate the arc sector element. The almond test body 200 contains the rotating cylinder 230 and ground plate 250 containing an antenna thereon. Portions of the arc sector 320 are underneath and on either side of the rotating cylinder 230, illustrating the approximate width of the arc sector 320. As previously mentioned, the top of the test body, including the top planar surface 201 of the test body, the antenna ground plate 250 and the wiper 240, is coplanar producing a flat contour 500 to simulate an infinite ground plane.

Figure 4:
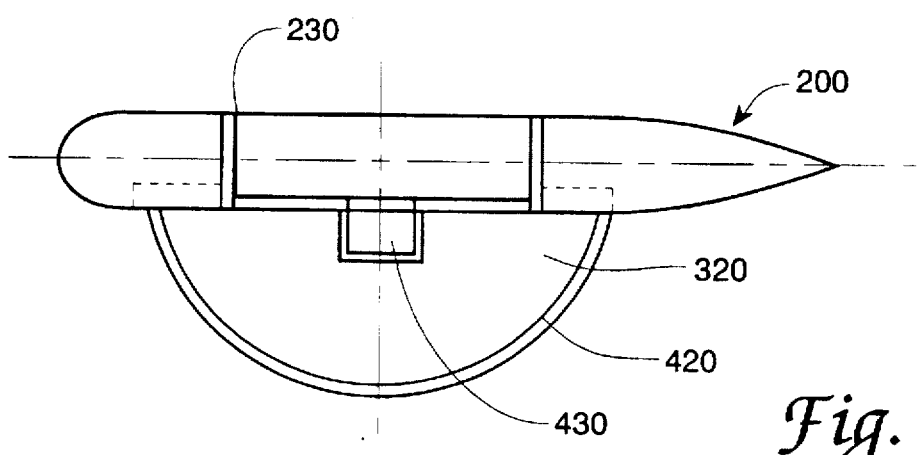
FIG. 4 shows a side view of the test body and arc sector.
Figure 5:
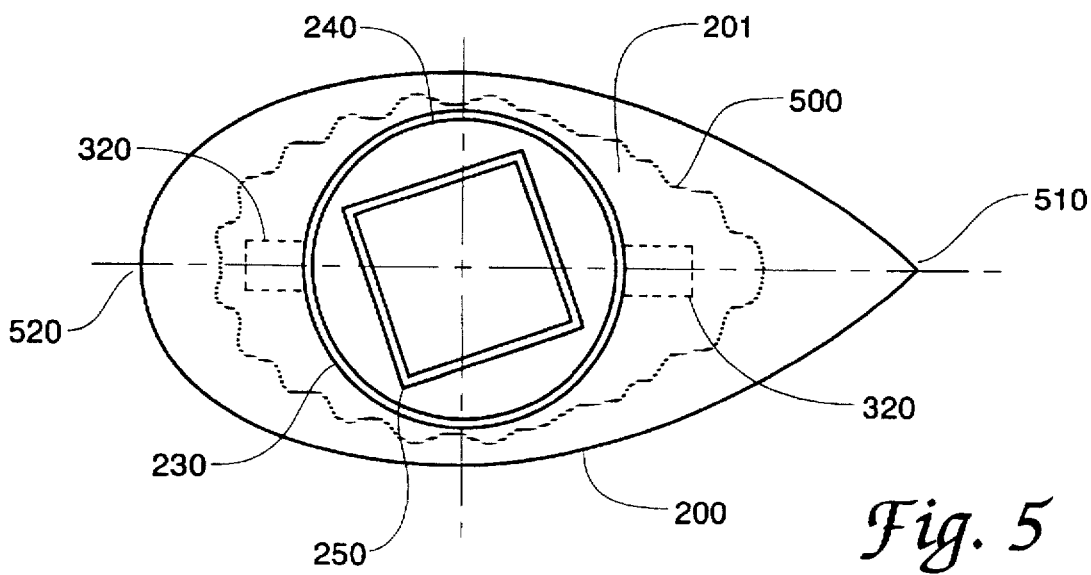
FIG. 5 shows a top view of the test body in accordance with the invention.

FIG. 4 illustrates two features of the arc sector. First, an aperture 430 within the planar surface of arc sector 320 allows antenna signals from the antenna test body 200 to exit the test body and also allows cords or wires to be connected to the rotating cylinder 230 or antenna as necessary. The aperture 430 is required for measuring a radiation sphere of an AUT, but is generally not needed if only scattering properties are under evaluation. The second feature illustrated in FIG. 4 is a lip 420 of the arc sector 320 and such lip is duplicated on the other side of the arc sector 320 forming a rim on the arcuate portion of the arc sector. The rim is illustrated at 700 in FIG. 7. The lip and resulting rim 700 allows a motor (not shown) contained within the support stand 330 to rotatably grip the rim of the arc sector 320. For example, rollers at 710 are placed on both sides of the lip on either side of the arc sector. The motor within the support stand 330 drives the rollers which in turn rotate the arc sector and alter the elevation (pitch) of the test body 200.

Figure 8:
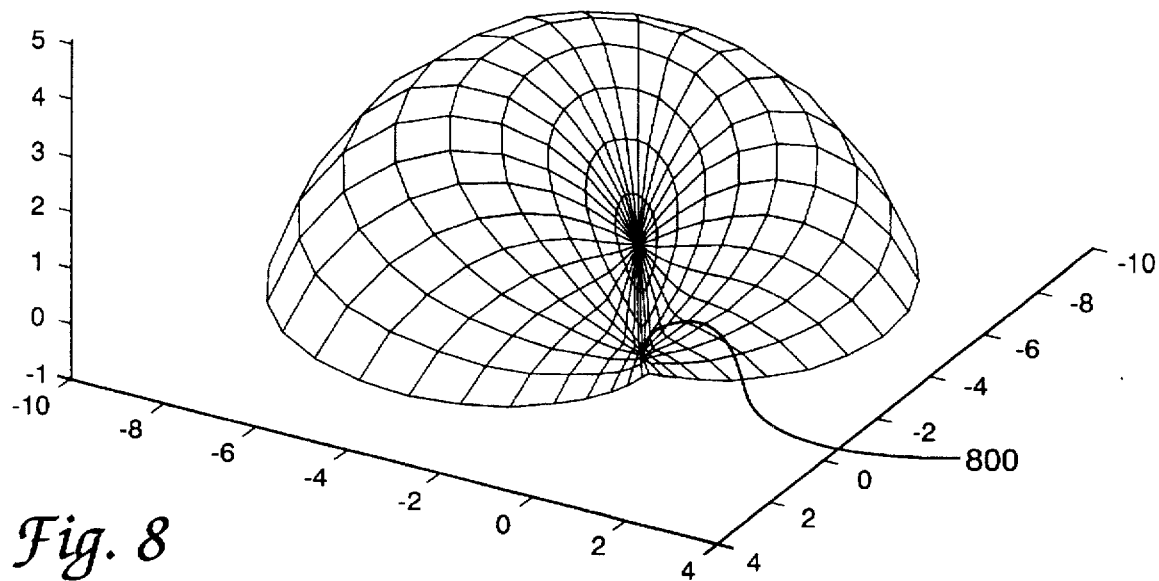
FIG. 8 shows a radiation sphere from a non-phase stationary antenna test body.
Figure 9:
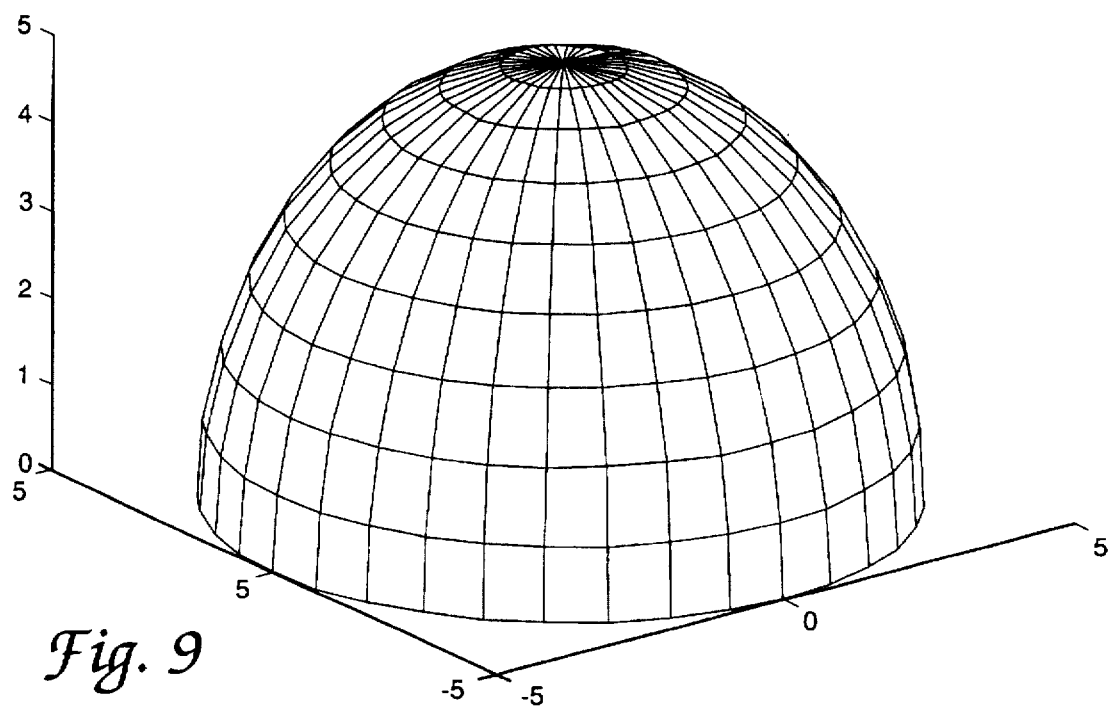
FIG. 9 shows a radiation sphere from a phase stationary antenna test body in accordance with the invention.

The variable elevation of the test body in accordance with the present invention is a feature unavailable in conventional test bodies. The novel advantages of variably elevating in accordance with the present invention are readily apparent when compared with the method of taking elevation measurements currently employed in the art. Currently, the test body is physically removed from a test stand consisting of a motorized Styrofoam cone or metal pylon, for example, and often a hole is then punctured on the side of the test body. The test body is held on its side with some type of bar inserted in the hole, remounted on the test stand and again rotated about the azimuth axis. The problems with this approach are that a designer is changing the axis of the antenna in order to take elevation pattern cuts of the antenna's radiation sphere. There is no phase stationary reference point from which both azimuth and elevation rotation measurements are taken. A radiation sphere obtained using a non-phase stationary test body is shown in FIG. 8 with phase distortion shown at 800. In contrast, a radiation sphere obtained using a phase stationary test body in accordance with the present invention is shown in FIG. 9. The calculations for predicting the radiation sphere of the antenna using both the azimuth and elevation pattern cuts obtained without a phase stationary reference point must be corrected accordingly. Therefore, the predicted radiation sphere of the antenna obtained by testing is less accurate due to the correction factor. Also, the test body on its side is not in its optimal position with respect to the incident beam, resulting in unnecessary signal scattering. The method of the present invention provides a phase stationary reference point as a function of angular orientation in which no correction is needed. Further, from a practical standpoint, the present invention avoids the need to damage a test body by boring a hole in its side and also allows testing to be performed without the interruption of remounting the test body.

A fully elevated test body is shown in FIG. 6. The arc sector 320 is elevated via rotating means as described in FIG. 7, where such rotating means communicates with lips or rim of the arc sector indicated at 630. The support stand 330 supports the arc sector 320. Another feature of the arc sector is that the entire arcuate portion of the arc sector is less than a full semi-circle, thus all incident rays parallel to the floor are reflected from the base of the septum towards a radio frequency measurement range chamber floor absorber, minimizing the reflected signal. As illustrated in FIGS. 3 through 6, the combination support stand and elevation system is shadowed by the test body 200, thus removing any extraneous error terms to interact with the AUT. The significance associated with the feature that the elevation system and support stand are in a different planar surface than the antenna resulting in shadowing is that there are less extraneous signals reflected, resulting in high accuracy measurements. In the fully elevated position, the antenna 251 seated in the ground plane is horizontally directed at the incident beam and the tip 620 of the antenna test body 200 at is pointing vertically downward.

While the present invention is illustrated using an almond shaped test body, any other shaped test body would be enhanced by the addition of the present invention.

We claim:

1. A phase stationary antenna test body comprising:
   a test body having a top, a bottom, an internal surface, an external surface and an axis of rotation, said top having an aperture for seating an antenna ground plate therein;
   a cylinder having a top surface connected to an antenna and a bottom surface, rotatably connected to an internal bottom surface of said test body, said cylinder axially aligned with said axis of rotation of said test body and having a static point of rotation between said test body and said cylinder;
   an arc sector for variably elevating said test body, having intersecting planar and arcuate surfaces, said planar surface integral with a bottom external surface of said test body and axially aligned with said axis of rotation of said test body resulting in a static point of rotation coincident with said static point of rotation of said cylinder; and
   support means for said arcuate surface for moving said test body in elevation.

2. The phase stationary antenna test body as in claim 1, wherein said cylinder further comprises a ring-shaped wiping member having an upper and lower surface, said lower surface integral with said top of said cylinder and extending horizontally therefrom, and a horizontal extension seated in a lip of said test body aperture thereby maintaining a continually conducting surface between said test body and said antenna ground plate.

3. The phase stationary antenna test body as in claim 2, further including a rotatable drive gear connected to the bottom of said cylinder for axially rotating said cylinder.

4. The phase stationary antenna test body as in claim 3, wherein said arc sector further comprises an aperture on said planar component for transmitting antenna signals from the bottom external surface of said antenna test body.

5. The phase stationary antenna test body as in claim 4, wherein said arcuate surface comprises a first and second side, said first and second side each having a lip extending outwardly therefrom forming a rim.

6. The phase stationary antenna test body as in claim 5, wherein said arc sector is less than a full half-circle.

7. The phase stationary antenna test body as in claim 6, wherein said support means contains motor means therein for rotating said arc sector.

8. The phase stationary antenna test body as in claim 7, wherein said motor means rotatably engage said lips of said arcuate surface.

9. The phase stationary antenna test body as in claim 8, wherein said support means has a low profile and is shadowed by said test body.

10. The phase stationary antenna test body as in claim 1, wherein said test body is almond shaped having a tip.

11. The phase stationary antenna test body as in claim 10, wherein said tip of the almond test body is continually directed at an incident beam.

12. The phase stationary antenna test body as in claim 2, wherein said cylinder is a right angle circular cylinder fabricated of fiber resin material.

13. A phase stationary antenna test body comprising:
   an almond test body having a top, a bottom, an internal surface, an external surface and an axis of rotation, said top having an aperture for seating an antenna therein said aperture having a lip thereon;
   a cylindrical body connected to said antenna, said cylindrical body having a top and a bottom and a wiping member, rotatably connected to the internal bottom surface of said test body and axially aligned with said axis of rotation of said test body having a static point of rotation between said test body and said cylindrical body, said wiping member integrally connected to said top of said cylindrical body whereby said wiper seats within said lip of said test body aperture and coplanar with said test body;
   an arc sector for variably elevating said test body, said arc sector having intersecting planar and arcuate surfaces, said planar surface integral with said bottom external surface of said test body and axially aligned with said axis of rotation of said test body having a static point of rotation coincident with said static point of rotation of said cylinder and said arcuate surface having first and second sides and lips extending therefrom forming a rim; and support means for supporting said test body, said arcuate surface of said arc sector rotatably connected thereto, and rotating means engaging said rim of said arcuate sector forming a rim.

14. A method for providing a phase stationary antenna test body comprising the steps of:

selecting a test body having a top, a bottom, an internal surface, an external surface and an axis of rotation, said top having an aperture for seating an antenna therein;

connecting said antenna to a cylindrical body having a top and a bottom, rotatably connecting said cylindrical body to the internal bottom surface of said test body so as to be axially aligned with said axis of rotation of said test body and having a static point of rotation between said test body and said cylindrical body;

variably elevating said test body using an arc sector having intersecting planar and arcuate surfaces, said planar surface integral with said bottom external surface of said test body and axially aligned with said axis of rotation of said test body resulting in a static point of rotation coincident with said static point of rotation of said cylinder; and supporting said test body with support means rotatably connected to said arcuate surface of said arc sector.

15. A method for providing a phase stationary antenna test body as in claim 14, further comprising the step of wiping said top external surface of said test body between said aperture and said rotating cylinder to prevent the entry of signals into said interior of said test body.

16. A method for providing a phase stationary antenna test body as in claim 14, further comprising the steps of:

transmitting signals through an aperture on said planar surface from said bottom external surface of said antenna test body; and sealing said aperture using a hatch.

17. A method for providing a phase stationary antenna test body as in claim 15 wherein said support stand and said antenna occupy different planar surfaces.

* * * * *